(12) United States Patent
Ma

(10) Patent No.: US 8,564,051 B2
(45) Date of Patent: Oct. 22, 2013

(54) POWER SEMICONDUCTOR DEVICE WITH BURIED SOURCE ELECTRODE

(75) Inventor: Ling Ma, Torrance, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/098,255

(22) Filed: Apr. 4, 2005

(65) Prior Publication Data

US 2005/0224871 A1  Oct. 13, 2005

Related U.S. Application Data

(60) Provisional application No. 60/560,959, filed on Apr. 9, 2004.

(51) Int. Cl.
*H01L 29/66* (2006.01)
(52) U.S. Cl.
USPC ............ 257/330; 257/341; 257/E29.257; 257/E29.118

(58) Field of Classification Search
USPC .............. 257/341, 401, E21.418, E29.257, 257/E29.118, 330
See application file for complete search history.

(56) References Cited

U.S. PATENT DOCUMENTS

| | | | |
|---|---|---|---|
| 5,998,833 A | 12/1999 | Baliga | |
| 6,660,591 B2 * | 12/2003 | Peake et al. ................... | 438/270 |
| 6,689,646 B1 * | 2/2004 | Joshi et al. ..................... | 438/149 |
| 7,183,610 B2 * | 2/2007 | Pattanayak et al. ........... | 257/333 |
| 2002/0030237 A1 * | 3/2002 | Omura et al. ................. | 257/397 |
| 2002/0036319 A1 * | 3/2002 | Baliga ........................... | 257/328 |
| 2002/0074585 A1 * | 6/2002 | Tsang et al. ................... | 257/302 |
| 2003/0139061 A1 * | 7/2003 | Jeng et al. ...................... | 438/775 |
| 2003/0160270 A1 * | 8/2003 | Pfirsch et al. ................. | 257/288 |
| 2005/0269630 A1 * | 12/2005 | Cao ............................... | 257/330 |

\* cited by examiner

*Primary Examiner* — Colleen Matthews
(74) *Attorney, Agent, or Firm* — Farjami & Farjami LLP

(57) ABSTRACT

A power semiconductor device that includes a buried source electrode disposed at the bottom of a trench below a respective gate electrode, and a source connector including a finger electrically connecting the buried source to the source contact of the device, and a process for fabricating the device.

9 Claims, 9 Drawing Sheets

POWER SEMICONDUCTOR DEVICE WITH BURIED SOURCE ELECTRODE

RELATED APPLICATION

This application is based on and claims benefit of U.S. Provisional Application No. 60/560,959, filed Apr. 9, 2004, entitled MOSFET With Buried Source Electrode and Process for the Manufacture Thereof, to which a claim of priority is hereby made and the disclosure of which is incorporated herein by reference.

BACKGROUND OF THE INVENTION

The breakdown voltage and the operating resistance (On resistance or Rdson) are important characteristics of a power semiconductor device. The Rdson of a conventional power device and the breakdown voltage of a power semiconductor device are inversely proportional. That is, the improvement in one adversely affects the other. To overcome this problem, U.S. Pat. No. 5,998,833 proposes a trench type power semiconductor in which buried electrodes are disposed within the same trench as the gate electrodes in order deplete the common conduction region under reverse voltage conditions, whereby the breakdown voltage of the device is improved. As a result, the resistivity of the common conduction region can be improved without an adverse affect on the breakdown voltage of the device.

The buried electrodes shown in U.S. patent No. '833 are electrically connected to the source contact of the device. The '833 patent, however, does not illustrate a structure for connection the source contact to the buried electrode.

SUMMARY OF THE INVENTION

It is an object of the present invention to provide a power semiconductor device that includes a buried source electrode disposed at the bottom of a trench below a respective gate electrode.

According to one aspect of the present invention a source connector that includes a finger electrically connects the buried source electrode to the source contact of the device.

According to one embodiment of the present invention at least one source connector includes a plurality of fingers each disposed within a respective trench and electrically connected to a respective buried source electrode disposed therein. The source connector further includes a common stripe extending across the trenches and electrically connected to the fingers.

According to another embodiment of the present invention, two or more spaced connectors provide interconnection between the buried source electrodes and the source contact in order to reduce the resistance between the source contact and the buried source electrodes, and to help even out the electric field created by the buried source electrodes.

The present application also discloses a novel method for fabricating a device having a buried source electrode beneath a respective gate electrode.

Other features and advantages of the present invention will become apparent from the following description of the invention which refers to the accompanying drawings.

BRIEF DESCRIPTION OF THE FIGURES

FIGS. 4A'-4S' illustrate cross-sectional views for the intermediate structures shown by FIGS. 4A-4S respectively, the cross-section being taken along line A-A and viewed in the direction of the arrows.

DETAILED DESCRIPTION OF THE FIGURES

Figure 1A:
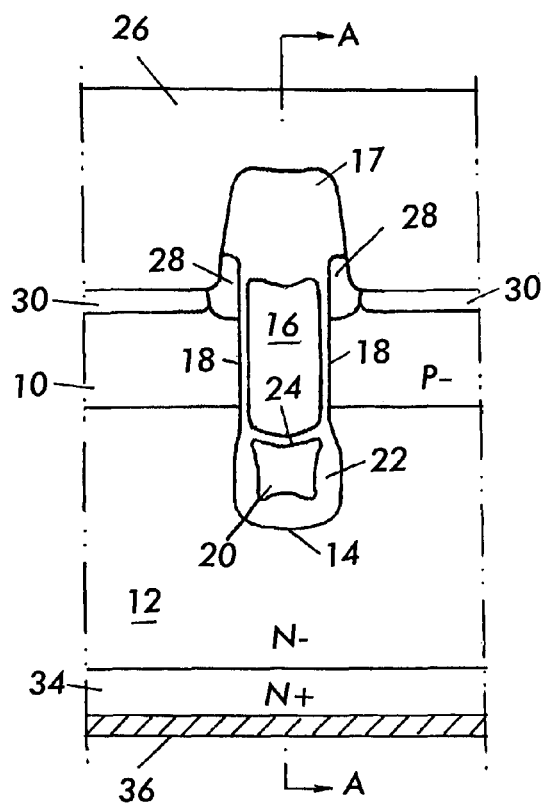
FIG. 1A illustrates a cross-sectional view of a single cell of a device according to the present invention.
Figure 1B:
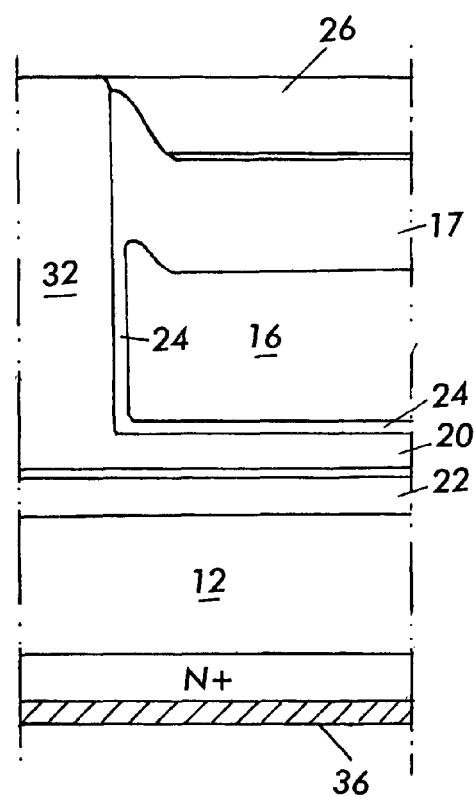
FIG. 1B illustrates a cross-sectional view of a portion of a device according to the present invention along line A-A and viewed in the direction of the arrows.

Referring to FIGS. 1A and 1B, a power semiconductor device according to the present invention includes base region 10, common conduction region 12, which is sometimes referred to as the drift region, and at least one trench 14, which extends through base region 10 to common conduction region 12. Contained within trench 14 is gate electrode 16 which is insulated from base region 10 by gate insulation layers 18 on the sidewalls of trench 14 adjacent base region 10 and insulated from source contact 26 by insulation plug 17. Gate electrode 16 may be formed with a conductive material such as polysilicon, and gate insulation layers 18 may be formed from silicon dioxide. Disposed below gate electrode 16 is a buried source electrode 20. Buried source electrode 20 is insulated from the surrounding common conduction region 12 by insulation body 22, which is preferably thicker than gate insulation layer 18, and resides adjacent the bottom of trench 14 and the bottom portion of its sidewalls. Gate electrode 16 and buried source electrode 20 are insulated form one another by insulation interlayer 24 disposed therebetween. Buried source electrode 20 is electrically connected to source contact 26. Source contact 26 is ohmically connected to source regions (not pictured in FIGS. 1A and 1B), which are formed in base region 10 adjacent trench 14, and high conductivity contact regions 30. To connect source contact 26 to buried source electrode 20, a device according to the present invention includes a source electrode connector that reaches down to buried source electrode 20. Specifically, the source electrode connector includes finger 32 that is electrically connected to source contact 26 and reaches and electrically connects to buried source electrode 20, whereby source contact 26 and buried source electrode 20 are electrically connected. It should be noted that finger 32 is adjacent to gate electrode 16, but that insulation interlayer 24 insulates gate electrode 16 from finger 32 as it extends between the two. That is, finger 32 is adjacent to, but spaced from electrode 16 and the space therebetween is occupied by a portion of insulation interlayer 24.

In the preferred embodiment, common conduction region 12 is a semiconductor material of one conductivity formed over a semiconductor substrate 34 of the same conductivity. Thus, for example, in an N-channel MOSFET, common conduction region 12 may be an epitaxially formed silicon of N-type conductivity formed over an N-type float-zone type substrate. In such a device, base region 10 and high conductivity regions 30 would be opposite in conductivity to common conduction region 12, i.e. P-type, and source regions would be the same conductivity as drift region; i.e. N-type. A drain contact 36, which is ohmically connected to substrate 34 allows for the vertical conduction of current between source contact 26 and drain contact 36 as is known. Also, in the preferred embodiment, buried source electrode 20 and finger 32 are composed of conductive polysilicon, while insulation body 22, insulation interlayer 24, and insulation plug 17 are composed of silicon dioxide. Source contact 26 and drain contact 36 may be formed of any suitable metal such as aluminum or aluminum silicon.

FIGS. 1A and 1B illustrate a single active cell in a power MOSFET according to the preferred embodiment of the present invention. Although only a single active cell is illustrated by FIGS. 1A and B, it should be appreciated that a plurality of identical active cells are present in a device according to the present invention. Thus, a device according to the present invention would include a plurality of trenches 14 each capable of supporting a buried source electrode 22 as well as a gate electrode 16 and other features found in the active cell shown by FIGS. 1A and 1B.

Figure 2:
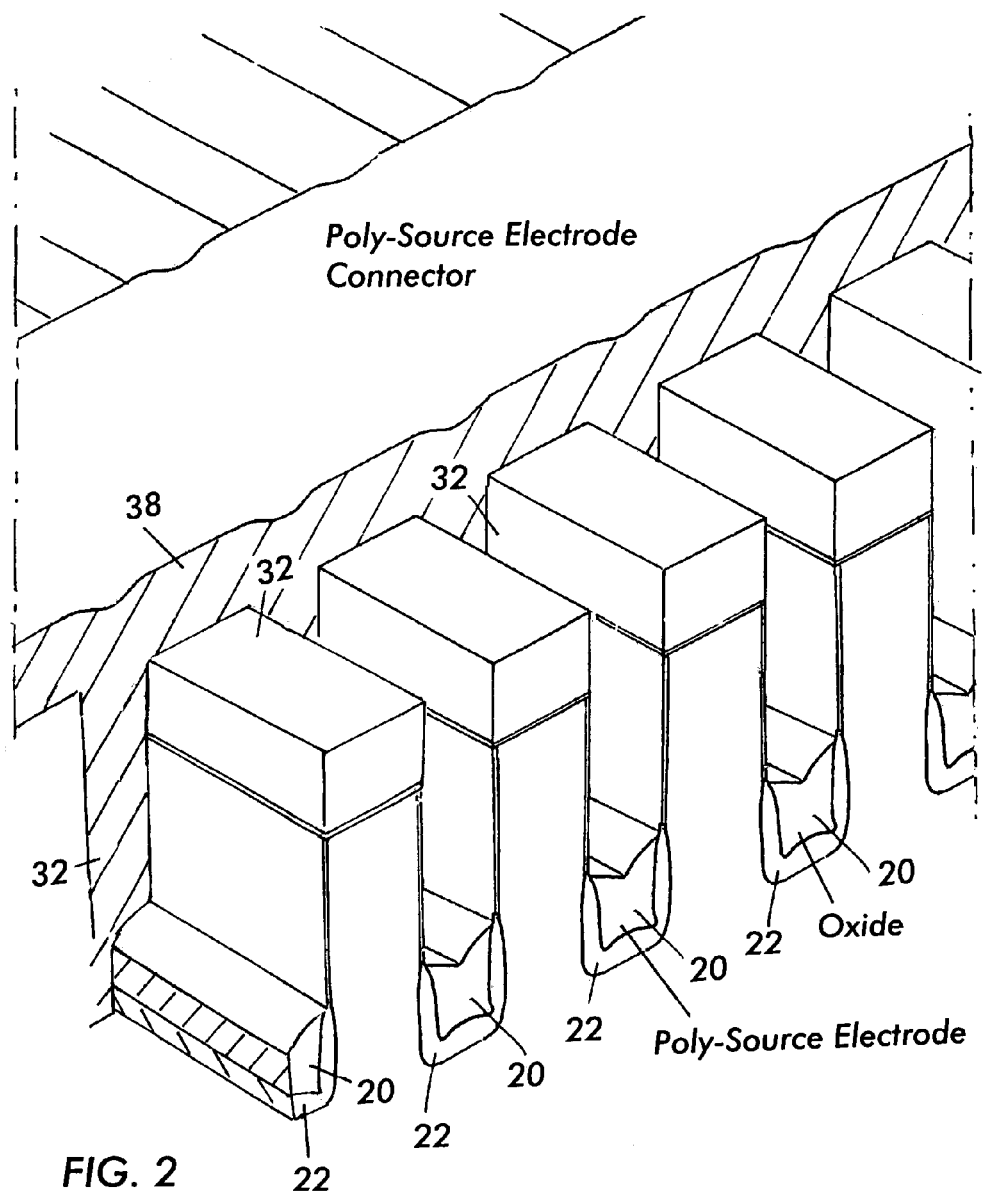
FIG. 2 shows a perspective cross-sectional view of an intermediate structure obtained (see FIGS. 4K and 4K') during a process for fabricating a device according to the present invention.

Referring to FIG. 2, it should be noted that source electrode connector includes a plurality of fingers 32, each extending into a respective trench 14 and connecting to a respective buried source electrode 20 therein. Fingers 32 are electrically connected to one another by at least one common strip 38 which runs across trenches 14. Strip 38 is ultimately electrically connected to source contact 26.

Figure 3:
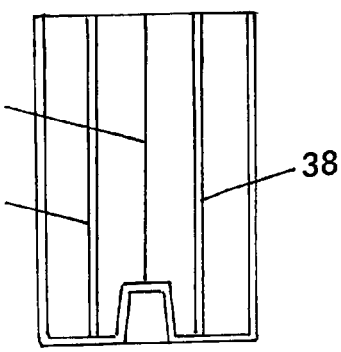
FIG. 3 shows a top plan view of a device having the top electrode thereof removed from view in order to illustrate a feature of the present invention.

It should be noted that a device according to the present invention may include more than one strip 38. Referring to FIG. 3, which schematically shows a top plan view of a device according to the present invention having source contact 26 thereof removed from view, a plurality of strips 38 may be electrically connected with a group of fingers 32 to form a plurality of source connectors, and gate runner 39 which is electrically connected to gate electrodes 16 is disposed therebetween to avoid being crossed. The source connectors so formed may be spaced from one another. Providing a plurality of source connectors may serve to reduce resistance between source contact 26 and buried source electrodes 20, and help even out the electric field produced by buried source electrodes 20.

Figure 4A:
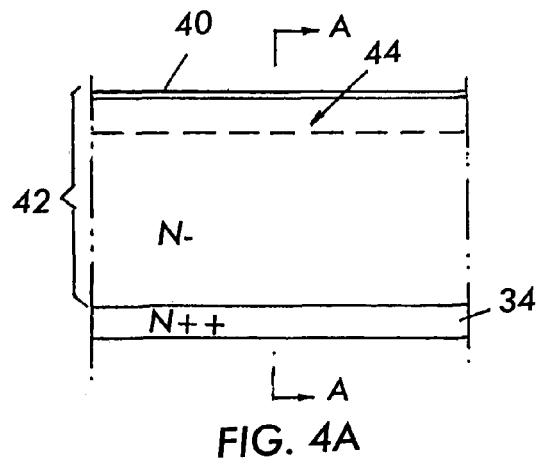
FIGS. 4A-4S illustrate the intermediate structures obtained during a process for forming a device according to the present invention.
Figure 4A:
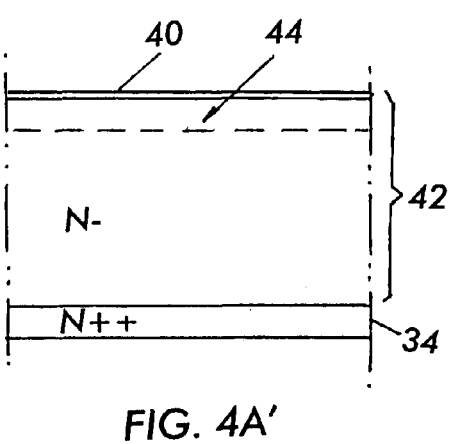

Referring to FIGS. 4A and 4A', to fabricate a device according to the present invention first a layer of pad oxide 40 is grown over a semiconductor body 42 of a first conductivity, which is, preferably an epitaxially formed silicon body of, for example, N-type conductivity that is disposed over a silicon substrate 34 of the same conductivity. Next, dopants of a second conductivity are implanted into semiconductor body 42 to form channel implant region 44.

Figure 4B:
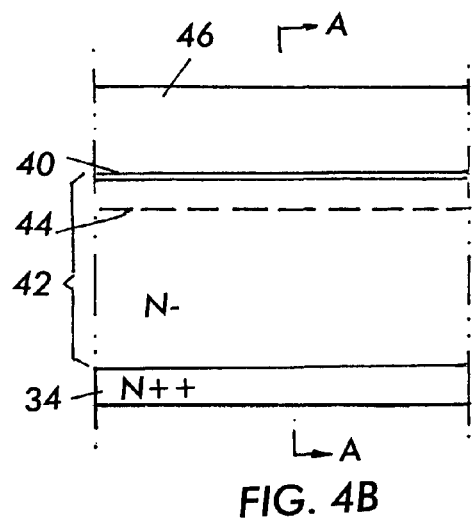
Figure 4B:
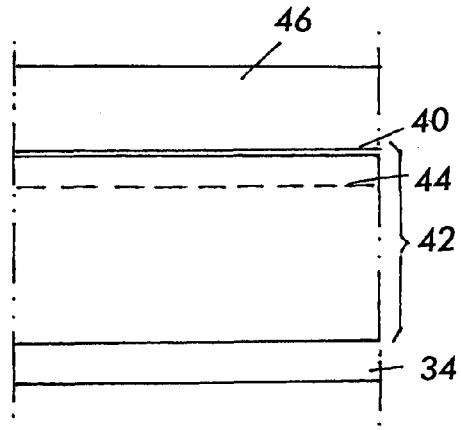
Figure 4C:
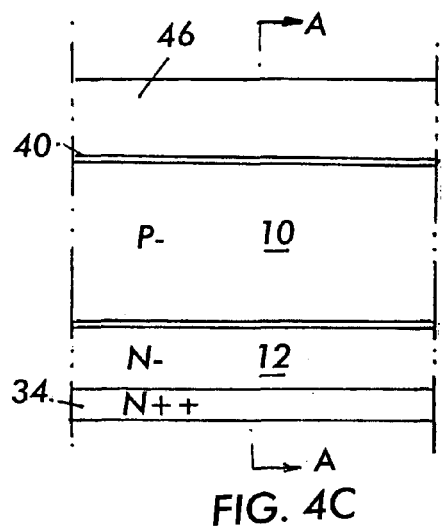
Figure 4C:
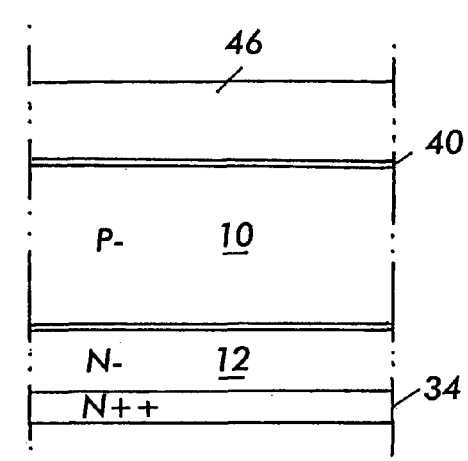

Referring next to FIGS. 4B and 4B', a layer of hard mask material 46, such as silicon nitride, is deposited over pad oxide 40. Layer 46 is then patterned to define a termination region and then a termination trench (not shown), according to a well known method for forming a trench termination. Thereafter, in a diffusion drive, the dopants in channel implant region 44 are driven to form base region 10, and define common conduction region 12 as seen in FIGS. 4C and 4C', and field oxide is formed in the termination trench (not shown).

Figure 4D:
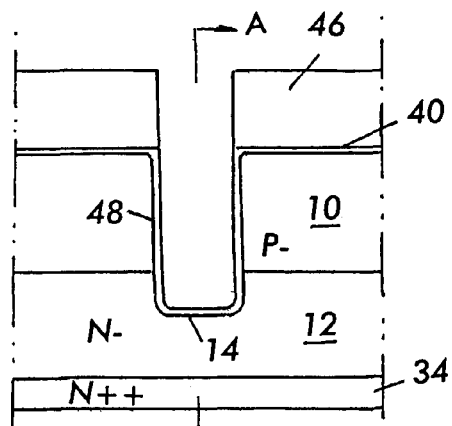
Figure 4D:
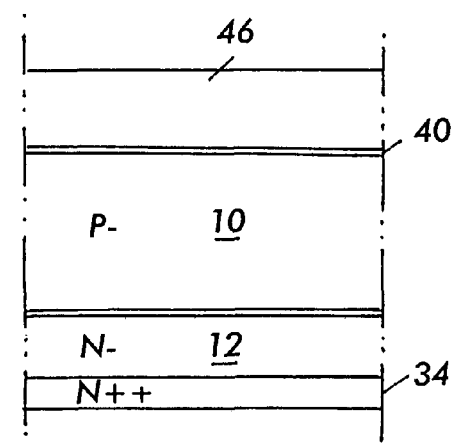

Referring next to FIGS. 4D and 4D', layer 46 is patterned to form a trench mask. The trench mask is used to define a plurality of preferably stripe-shaped trenches 14 as seen in FIG. 2. However, for the sake of simplicity only one trench is shown hereafter. Trenches 14 are defined to extend from the top of semiconductor body 42 to below base region 10. Sacrificial oxide 48 is then grown on the sidewalls and the bottom of trenches 14.

Figure 4E:
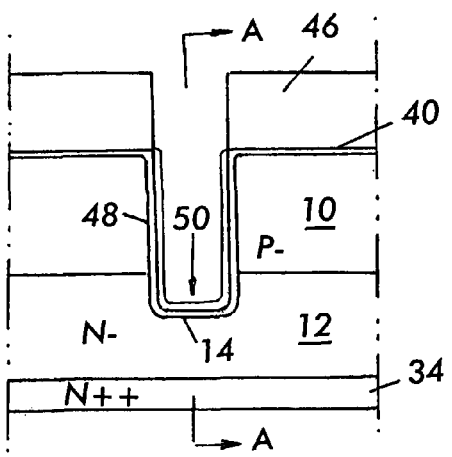
Figure 4E:
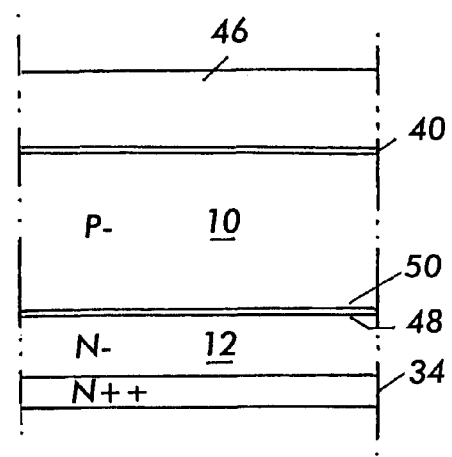
Figure 4F:
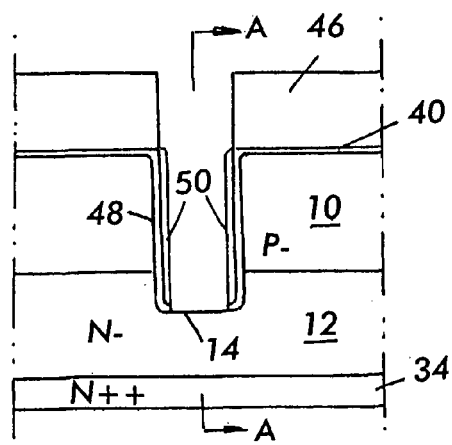
Figure 4F:
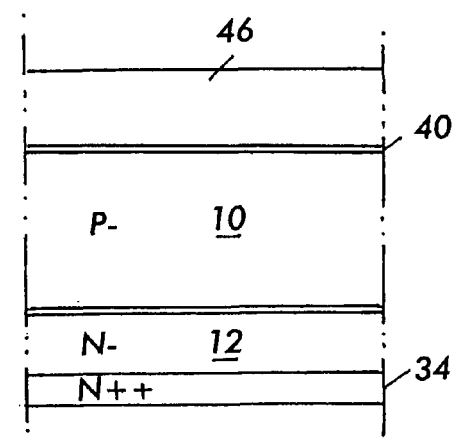

Referring next to FIGS. 4E and 4E', a layer of oxidation retardant material 50, such as silicon nitride, is grown over sacrificial oxide 48 on the sidewalls and the bottom of each trench 14. Thereafter, oxidation retardant material 50 and sacrificial oxide 48 are removed from the bottom of each trench 14 exposing the semiconductor below, as illustrated by FIGS. 4F and 4F'.

Figure 4G:
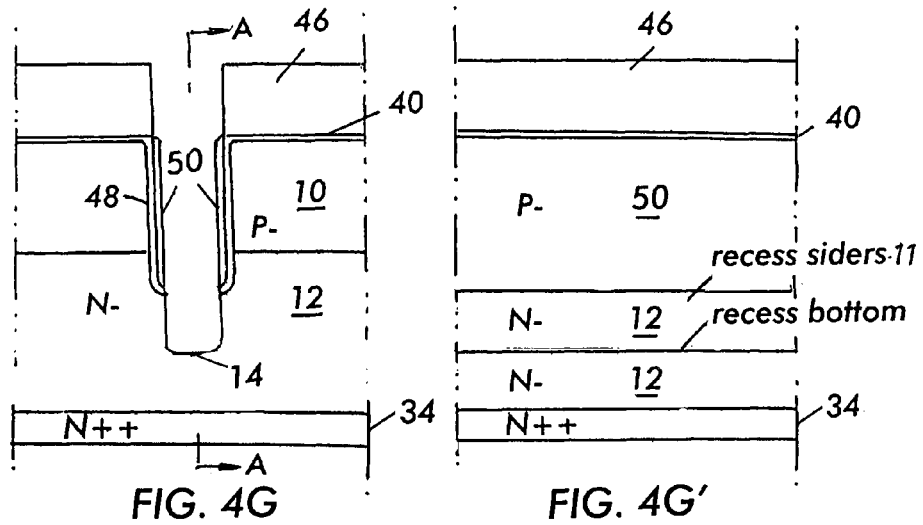
Figure 4H:
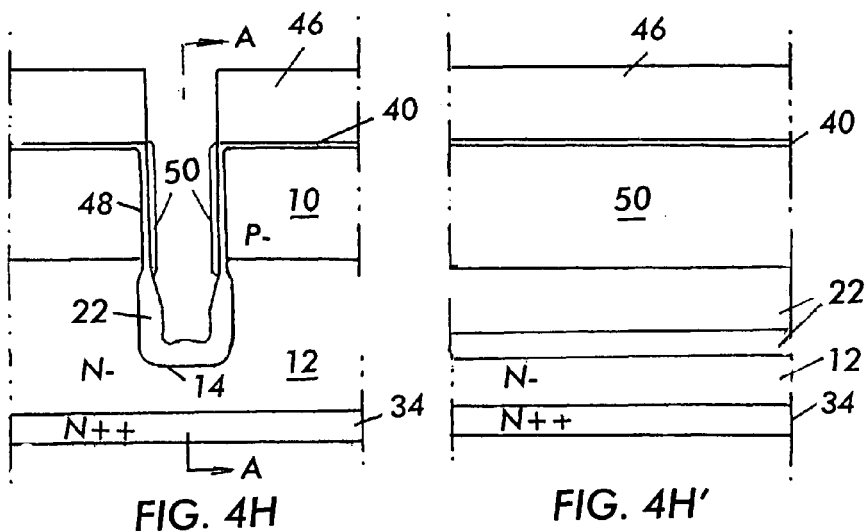

Referring next to FIGS. 4G and 4G', a recess is formed at the bottom of each trench 14 by removing semiconductor material, whereby each trench 14 is extended deeper. The sidewalls and the bottom of each recess are then oxidized to form insulation body 22 over the same as illustrated by FIGS. 4H and 4H'.

Figure 4I:
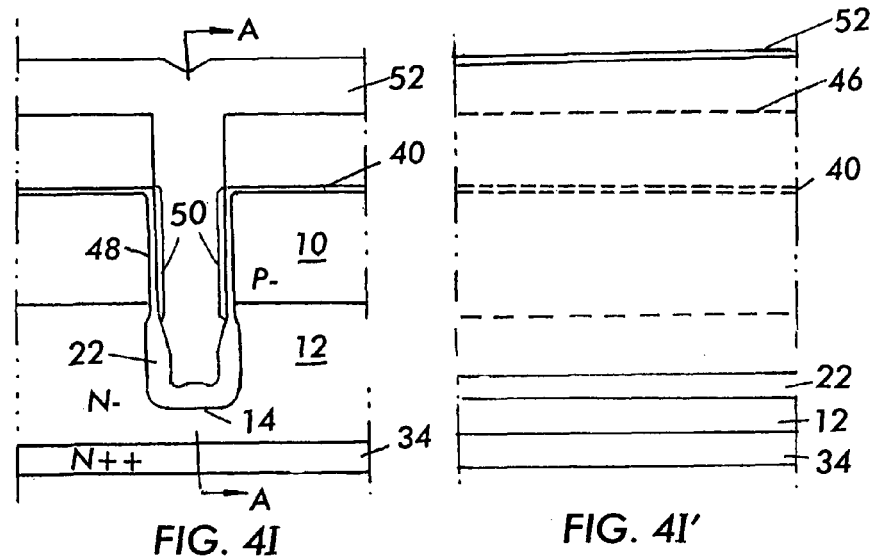
Figure 4J:
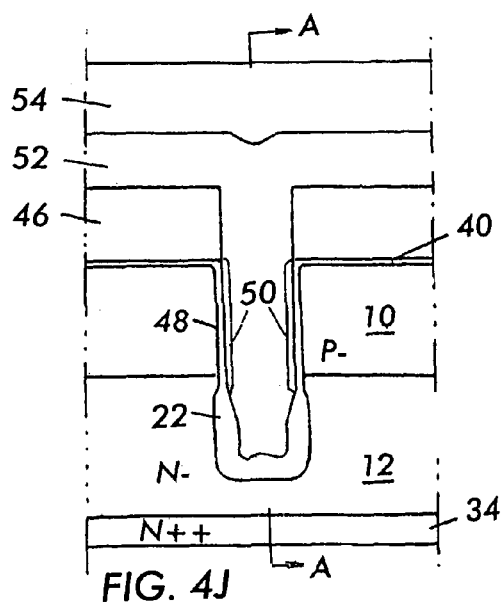
Figure 4J:
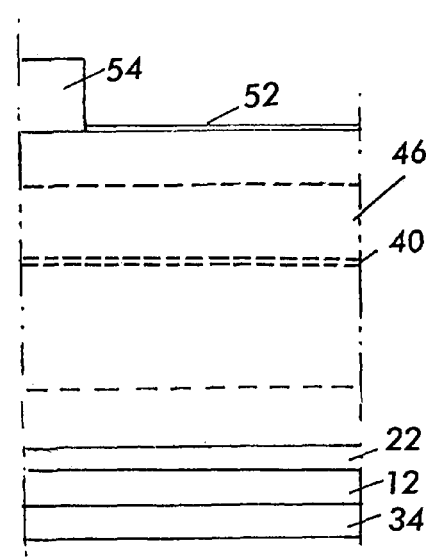
Figure 4K:
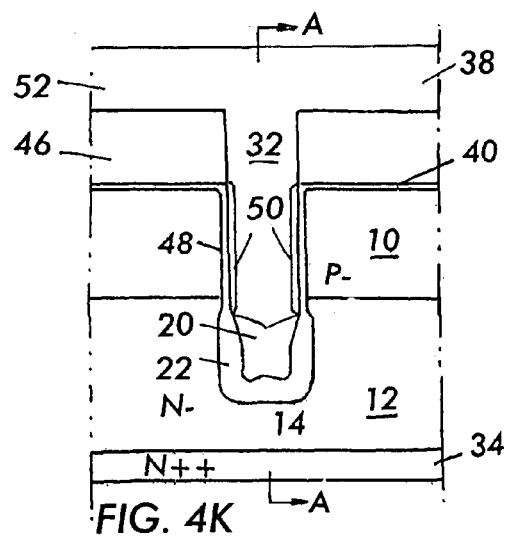
Figure 4K:
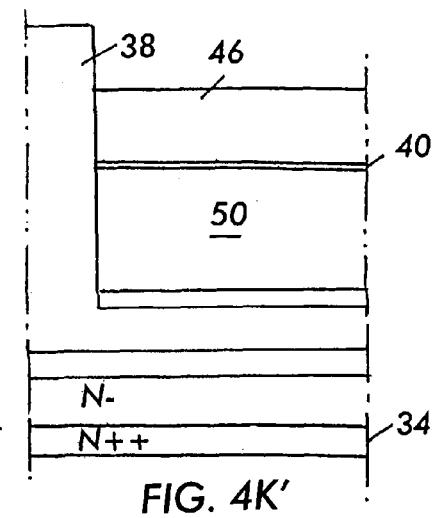

Next, conductive material 52, such as polysilicon is deposited within each trench 14 as seen in FIGS. 4I and 4I'. Thereafter, mask 54 is formed over polysilicon 52 as seen in FIGS. 4J and 4J', and the portions of polysilicon 52 not covered by mask 54 are removed to define buried source electrodes 20, fingers 32 and strip 38 of source electrode connector as seen in FIGS. 4K and 4K'.

Figure 4L:
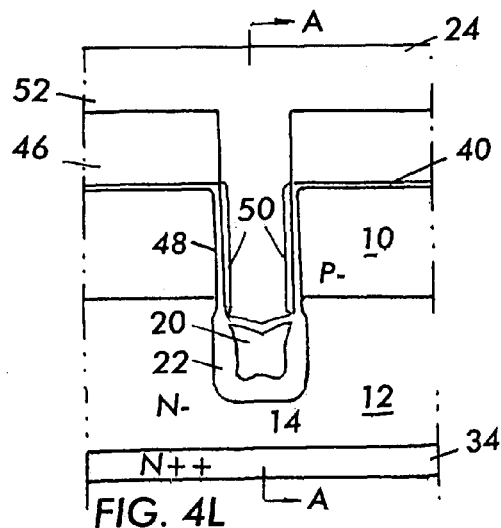
Figure 4L:
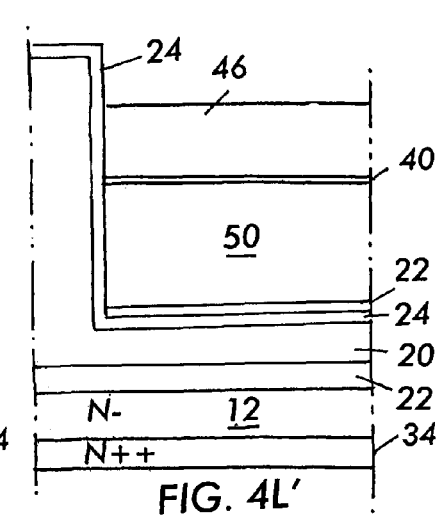
Figure 4M:
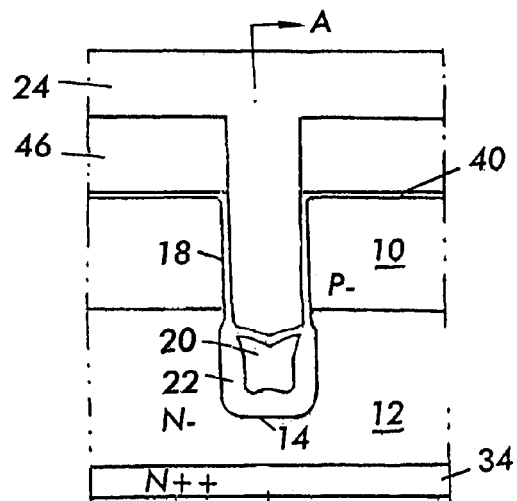
Figure 4M:
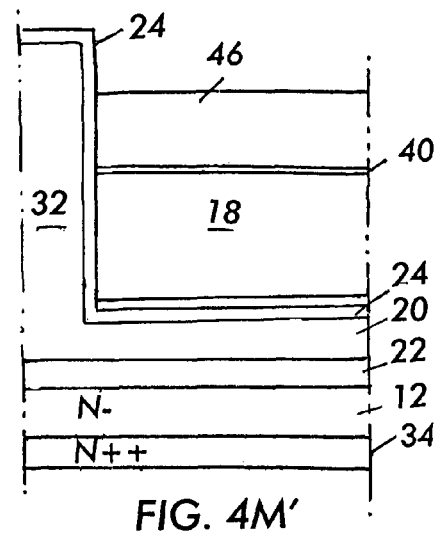

Next, the exposed surfaces of polysilicon 52 are oxidized to form insulation interlayer 24 over the exposed surfaces of fingers 32 and buried source electrodes 20 as seen in FIGS. 4L and 4L', and then oxidation retardant 50 and sacrificial oxide 48 are removed from the sidewalls of each trench 14 and the sidewalls are oxidized to form gate insulation 18 thereon as seen in FIGS. 4M and 4M'.

Figure 4N:
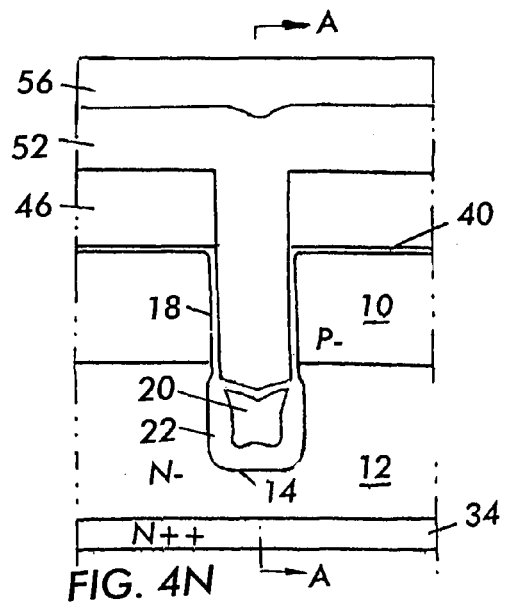
Figure 4N:
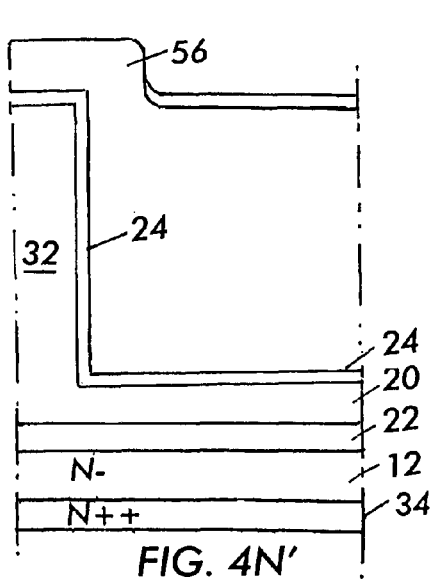
Figure 4O:
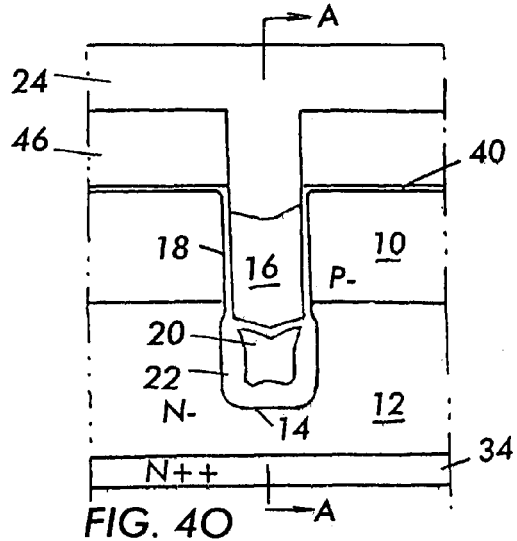
Figure 4O:
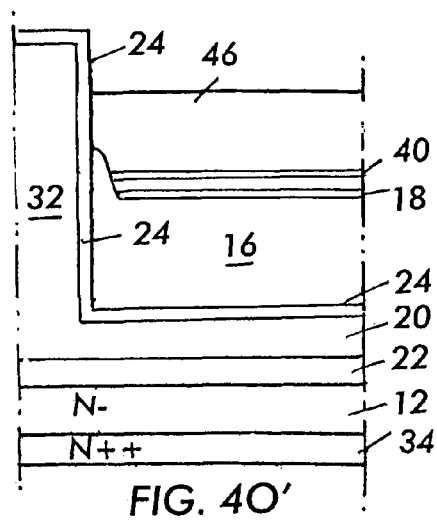
Figure 4P:
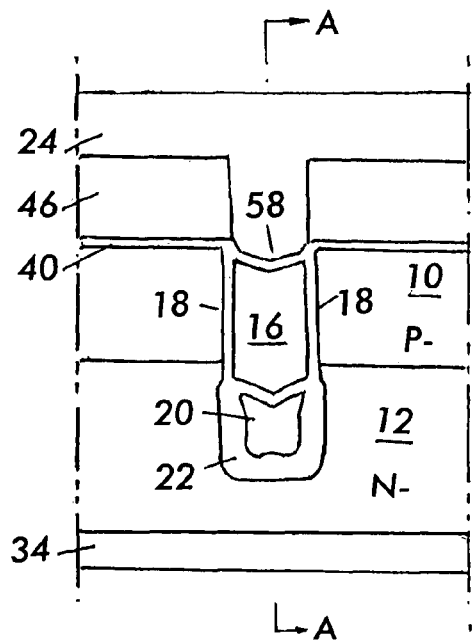
Figure 4P:
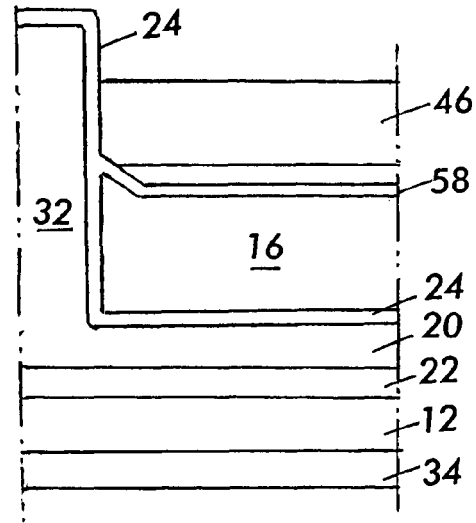
Figure 4Q:
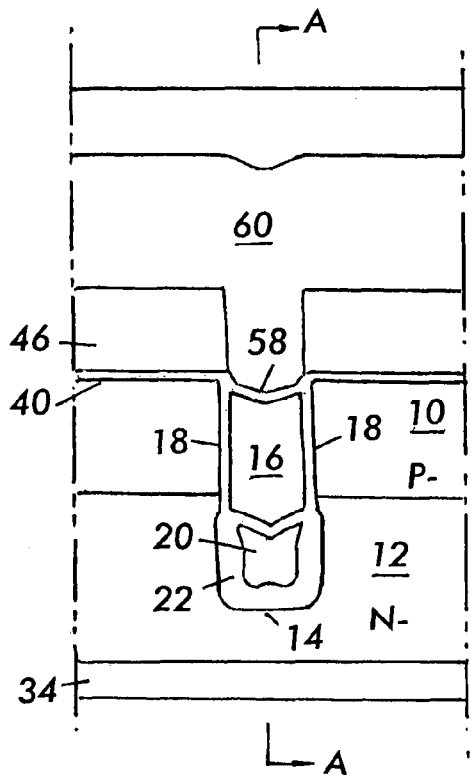
Figure 4Q:
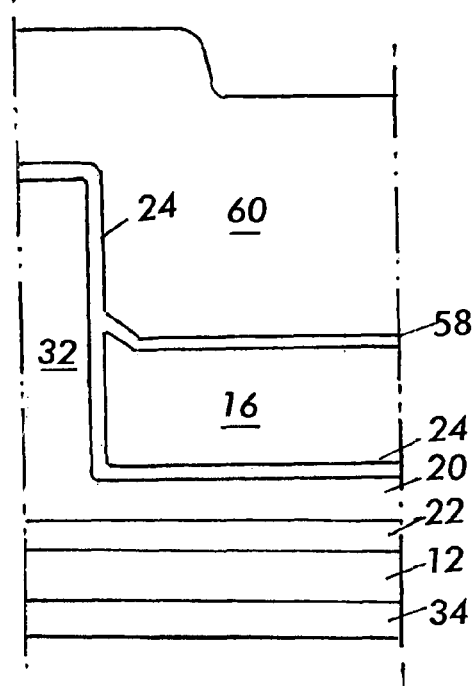
Figure 4R:
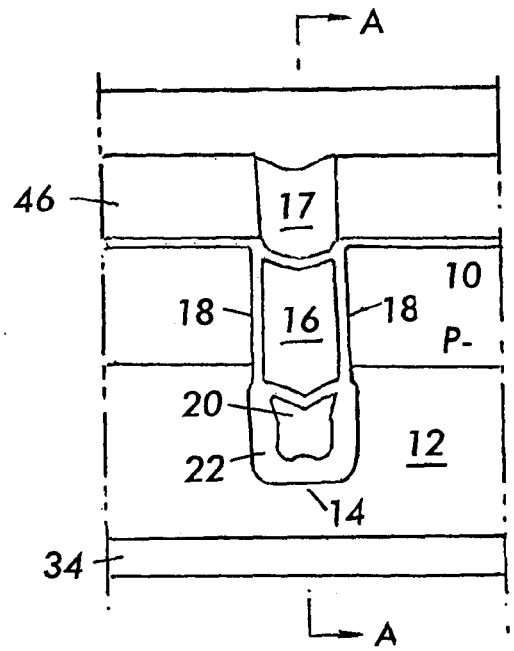
Figure 4R:
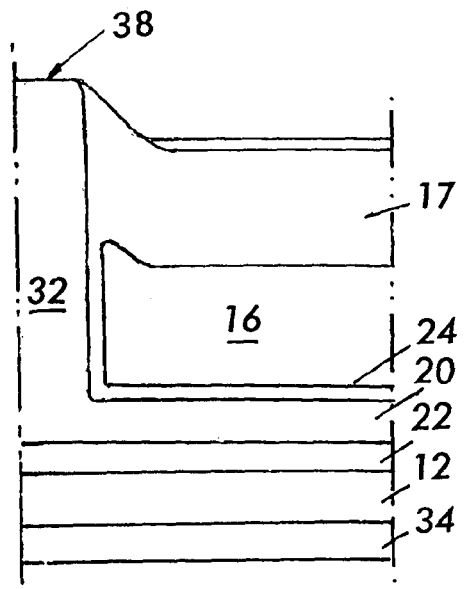
Figure 4S:
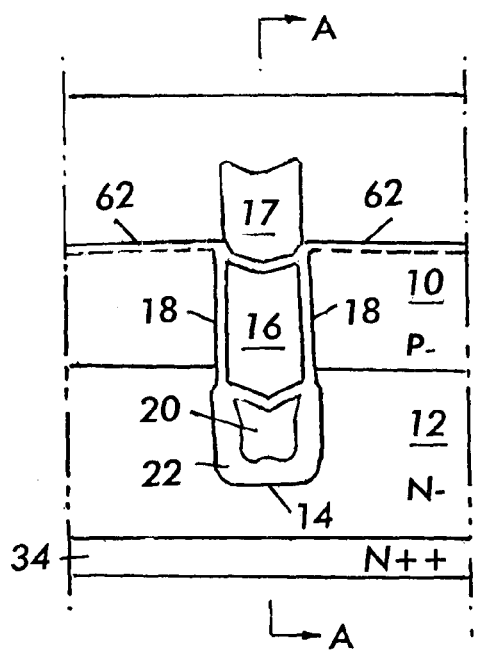
Figure 4S:
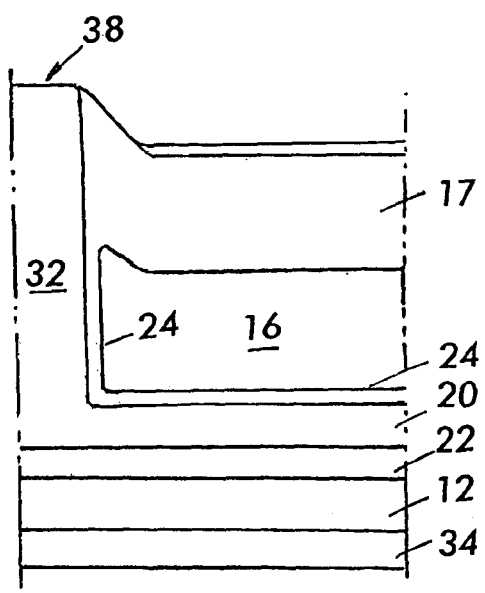

Next, conductive material 56 for the gate electrodes, such as polysilicon, is deposited within each trench 14 over buried source electrodes 20 as illustrated by FIGS. 4N and 4N'. Thereafter, the excess polysilicon is removed to define gate electrodes 16 inside each trench 14 as seen in FIGS. 4O and 4O'. Next, the top portion of each gate electrode 16 is oxidized to form an insulation barrier 58 as seen in FIGS. 4P and 4P', and then insulation 60, such as TEOS or the like, for forming oxide plugs 17 is deposited over each gate electrode 16 as seen in FIGS. 4Q and 4Q'. Thereafter, insulation 60 is etched to define plugs 17 over each gate electrode 16 as seen in FIGS. 4R and 4R', and then mask 46 is removed, and dopants of the first conductivity are implanted in base region 10 to form source implant region 62.

Next, contact spacers are formed on the sidewalls of each plug 17, source implants are driven to form source regions 28, implants of the second conductivity are implanted in base region 10 and driven in a diffusion drive to form high conductivity contact regions 30 and source metal is deposited and patterned to form source contact 26 in any known manner. Also, drain metal is deposited by sputtering or the like on substrate 34 to form drain contact 36 in any known manner, whereby a device according to the present invention is realized.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
    a semiconductor body that includes:
    a base region;
    a source region disposed on said base region;
    at least one high conductivity contact region disposed on said base region;
    a common conduction region below said base region;
    a plurality of trenches extending through said base region, each trench extending into said semiconductor body from a top surface of said semiconductor body and including a bottom and opposing sidewalls;

a gate electrode disposed inside each trench and insulated from said base region by a respective gate insulation layer, said gate electrode including a bottom surface and a top surface which is below said top surface of said semiconductor body;

an insulation plug residing over a respective top surface of a respective gate electrode and extending above said top surface of said semiconductor body;

a buried source electrode in each trench disposed below and insulated from a respective gate electrode by an insulation interlayer substantially thinner than said insulation plug, said buried source electrode not extending beyond said common conduction region;

at least one source electrode connector;

a source contact electrically coupled to said at least one source electrode connector and extending over said insulation plugs, whereby said source contact is electrically connected to said buried source electrodes; and an insulation body disposed between said buried source electrodes and said common conduction region.

2. A power semiconductor device according to claim 1, wherein said at least one source electrode connector is adjacent to and insulated from a respective gate electrode.

3. A power semiconductor device according to claim 1, wherein each buried source electrode is insulated from said common conduction region by an insulation body.

4. A power semiconductor device according to claim 3, wherein said insulation body is thicker than said gate insulation layer.

5. A power semiconductor device according to claim 3, wherein said insulation body is comprised of silicon dioxide.

6. A power semiconductor device according to claim 1, wherein said gate insulation layer is comprised of silicon dioxide.

7. A power semiconductor device according to claim 1, wherein said common conduction region and said base region are formed in a silicon body, said silicon body being disposed over a silicon substrate.

8. A power semiconductor device according to claim 7, further comprising a drain contact electrically connected to said substrate.

9. A power semiconductor device according to claim 1, further comprising a gate runner.

* * * * *